(12) United States Patent
Fant et al.

(10) Patent No.: US 8,633,765 B2
(45) Date of Patent: Jan. 21, 2014

(54) INPUT COMMON MODE CIRCUIT FOR A FULLY DIFFERENTIAL AMPLIFIER

(75) Inventors: Andrea Fant, Nimis (IT); Luca Sant, Tarcento (IT); Patrick Vernei Torta, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/109,737

(22) Filed: May 17, 2011

(65) Prior Publication Data
US 2012/0293258 A1 Nov. 22, 2012

(51) Int. Cl.
*H03F 3/45* (2006.01)
(52) U.S. Cl.
USPC .............................................. 330/69; 330/258

(58) Field of Classification Search
USPC ................................................ 330/9, 69, 258
See application file for complete search history.

(56) References Cited

U.S. PATENT DOCUMENTS

| 5,614,864 A | * | 3/1997 | Stubbe et al. | 330/69 |
| 6,100,759 A | * | 8/2000 | Sirna et al. | 330/252 |
| 6,566,961 B2 | * | 5/2003 | Dasgupta et al. | 330/301 |

* cited by examiner

*Primary Examiner* — Steven J Mottola
(74) *Attorney, Agent, or Firm* — SpryIP, LLC

(57) ABSTRACT

This application describes a system for minimizing the common mode voltage drift at the input of a fully differential amplifier. An impedance component is coupled to the inputs and outputs of the differential amplifier. The impedance component optimizes the common mode resistance or impedance to ground without significantly affecting the differential impedance, matches the input common mode voltage to the output common mode voltage and reduces the input common mode voltage drift in presence of leakage currents.

19 Claims, 6 Drawing Sheets

INPUT COMMON MODE CIRCUIT FOR A FULLY DIFFERENTIAL AMPLIFIER

BACKGROUND

Fully differential amplifiers have been increasingly used in high-speed data systems. For example, differential amplifiers are used to drive the inputs of analog to digital converters (ADC), both Nyquist rate and oversampling sigma-delta converters. Typically, fully differential amplifiers have two inputs and two outputs; the incoming differential signal is amplified and outputted as a differential signal of much larger amplitude. The input differential signal is ideally purely differential, i.e. having the voltage at the two inputs opposite in phase and no common mode voltage components (i.e. the semi sum of the two input signals should be zero). If a common mode component is present, for example when the two inputs are shorted to the same voltage (no differential component), the differential amplifier should reject the common mode component of the input signal and have a differential output voltage that only depends on the input differential voltage, so in this case it should be zero . . . .

Ideally, the differential amplifier does not output a signal when operating under the common mode condition. A circuit implementation of a fully differential amplifier will reject the common mode voltage component with a high efficiency but not completely, causing common mode output drifts and/or common mode to differential signal transposition in response to a change of the input's common mode component. Furthermore, changes in common mode at the input will cause other effects, such as common mode current flow between the output to the input signals, change of operating point of the operational amplifier and of the devices connected to the input network.

If the input signal has an undefined common mode (floating source, differential passive device, transformer, etc.) the amplifier feedback network will be forcing the common mode from the amplifier's output, bringing the input common mode to a well defined level. In such cases any leakage current or component mismatch would influence the common mode level, with the effects described above. Common mode shifts at the input are more likely if the common mode impedance at the input nodes is high, such as when the (equivalent) input resistance and the feedback resistors are large in value or if an integrator stage is realized with the fully differential operational amplifier.

Some common mode current solutions have included an additional circuit attached to the differential amplifier that controls the input common mode voltage to match the output common mode voltage. This approach is disadvantageous in that the input common mode voltage generator or the output common mode control loop had to be matched or offset compensated by an additional circuit that requires additional power and device area.

SUMMARY

This Summary is provided to introduce the simplified concepts for devices and methods used to implement a circuit arrangement to control the input common mode voltage in a fully differential amplifier. The devices and systems are described in greater detail below in the Detailed Description. This Summary is not intended to identify essential features of the claimed subject matter nor is it intended for use in determining the scope of the claimed subject matter.

In an exemplary implementation, an impedance component is coupled to the two inputs and two outputs of a fully differential amplifier. The impedance component is arranged to set the input common mode voltage to match the output common mode voltage. Each input and output of the differential amplifier may be coupled to a resistor whose value is set to fulfill the functional requirements of the stage, in terms of amplification, stability, or other factors. If the input signal's common mode is nominally the same as the output common mode, a common mode current will flow and move the amplifier's input common mode to the output common mode at power-up and the common mode current will be minimized at steady-state. If the input signal's common mode differs from the output common mode, in steady-state conditions, the current will still exist and will cause an amplifier input common mode that is different (and somewhere in-between) from the input's signals and the output's signal common mode levels.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

This disclosure relates to a fully differential amplifier that incorporates an impedance component to reduce the amount of common mode current through the amplifier.

A fully differential amplifier includes an amplifier with two inputs and two outputs. The difference between the incoming signals is amplified by the differential amplifier. However, when subject to common mode variations (semi-sum of the input signals), the amplifier is not intended to produce an amplified signal under ideal conditions. But, physical implementations of the differential amplifiers operate under less than ideal conditions for a variety of reasons. The devices have a defined sensitivity to the common mode input voltage that translates into a change of the differential voltage at the output. The input common mode can move, for example, when set by a previous stage that has a high output impedance and/or in presence of a leakage current. This induces a change of common mode voltage at the input of the amplifier and causes a worsening of the operating conditions of the devices. In general it would also translate in an unwanted change of differential output voltage. As described in detail below, the input common mode voltage may be balanced against the output common mode voltage to reduce the common mode drift using an impedance component coupled to the input and output of the fully differential amplifier.

Example Sigma Delta Modulator with a Fully Differential Amplifier

Figure 1:
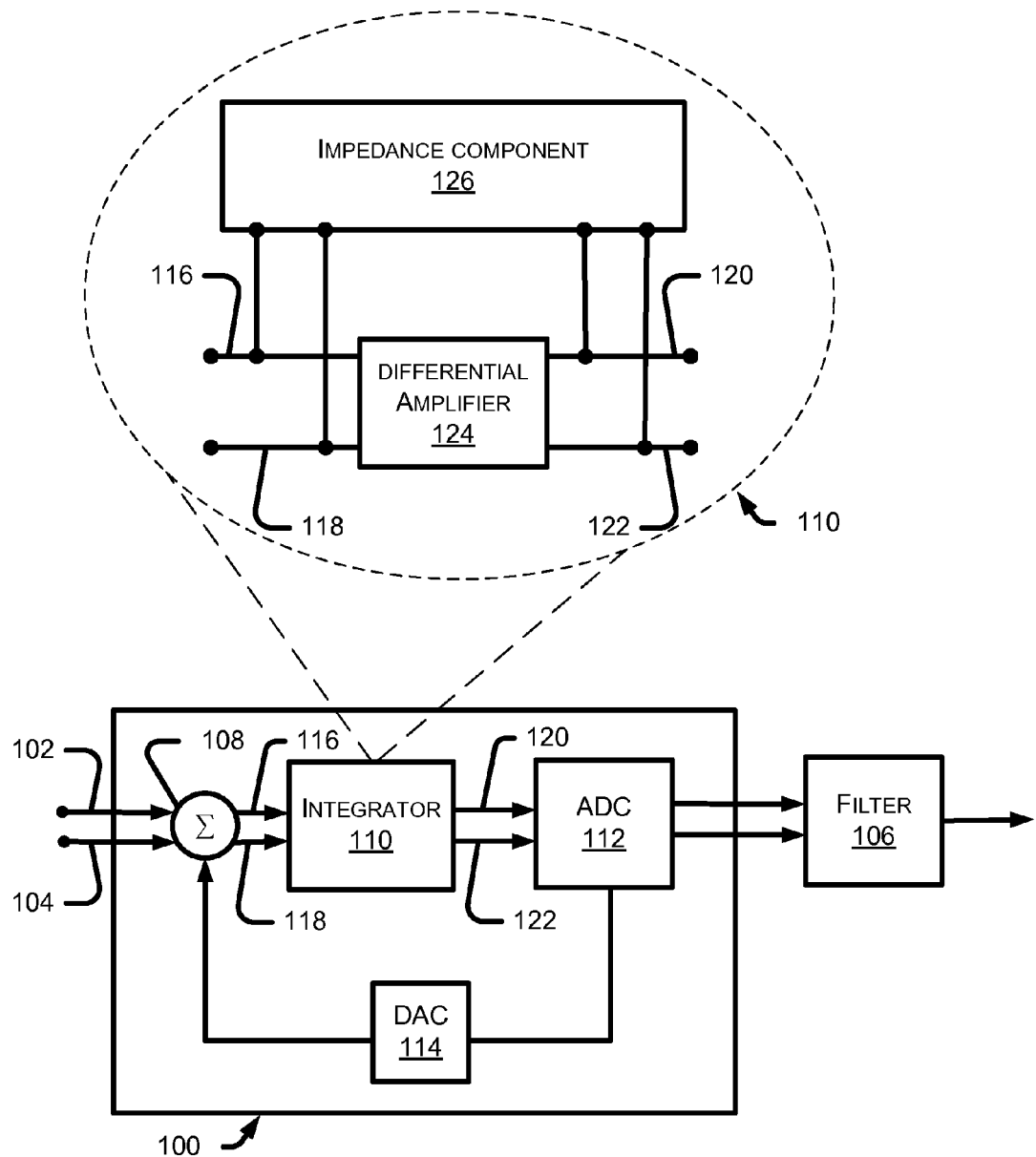
FIG. 1 is a schematic diagram of a sigma-delta modulator that incorporates a fully differential amplifier coupled to an impedance component.

FIG. 1 is an illustration of a sigma-delta modulator 100 that has two inputs 102 and 104 that receives analog signals that are converted to digital signals that are provided to a digital filter 106. In one implementation, the sigma-delta modulator 100 may be incorporated into a cell phone that receives analog voice signals that are converted to digital signals for transmission to a cellular base station (not shown) of a wireless network (not shown).

The sigma-delta modulator 100 may include a summing node 108, an integrator 110, an analog-to-digital converter 112, and a feedback digital-to-analog converter 114. As shown in FIG. 1, the summing node 108 receives a differential analog signal via inputs 102 and 104 and an analog feedback signal from feedback DAC 114. The summing node 108 subtracts an analog feedback signal provided by the DAC 114 in to the input signals from inputs 102 and 104 and provides the differential analog signals via outputs 116 and 118 to the integrator 110. The integrator 110 may operate as a low pass filter that provides filtered differential signals to the ADC 112 via outputs 120 and 122. In addition to provide the aforementioned digital signals to the digital filter 106, the ADC 112 provides the digital feedback signal to the DAC 114 that converts the digital feedback signal to an analog signal that is provided to the summing node 108.

In one implementation, the integrator 110 may include an electrical component, such as a differential amplifier 124, and an impedance or control component 126 to minimize the input common mode voltage drift. As discussed above, differential amplifiers are intended to amplify the difference between the two signals provided on each input. However, when the difference between the two signal is zero or near zero the differential amplifier 124 may still generate a small amount of output voltage, at least in part due to the change of the input common mode voltage. The dependence on the input's common mode variation may negatively impact the performance of the differential amplifier. Accordingly, it would be desirable to minimize the common mode voltage variations. In this implementation, the impedance component 126 is intended to minimize the common mode signal at the input of the amplifier by reducing the equivalent common mode impedance from the input common mode to the output common mode voltage of the differential amplifier 124, which is regulated by an available common mode control loop, the control loop being described further in FIG. 5. The common mode voltage may be determined by adding the voltage at output 120 and the voltage at output 122 and dividing their sum by two. This voltage is physically estimated by adding two resistors of equal value in series between the output 120 and the output 122. The common mode voltage can be measured at the intermediate node between the two resistors, as shown and discussed in FIG. 3 at node 308. The impedance component generates the input common mode voltage based in part on the output common mode voltage and provides an input voltage to differential amplifier 124 that minimizes the common mode drift at the inputs of the differential amplifier 124. The generation of the input common mode voltage by the impedance component will be discussed in detail in the remarks for FIG. 3A.

Example Common Mode Circuit with Fully Differential Amplifier

Figure 2:
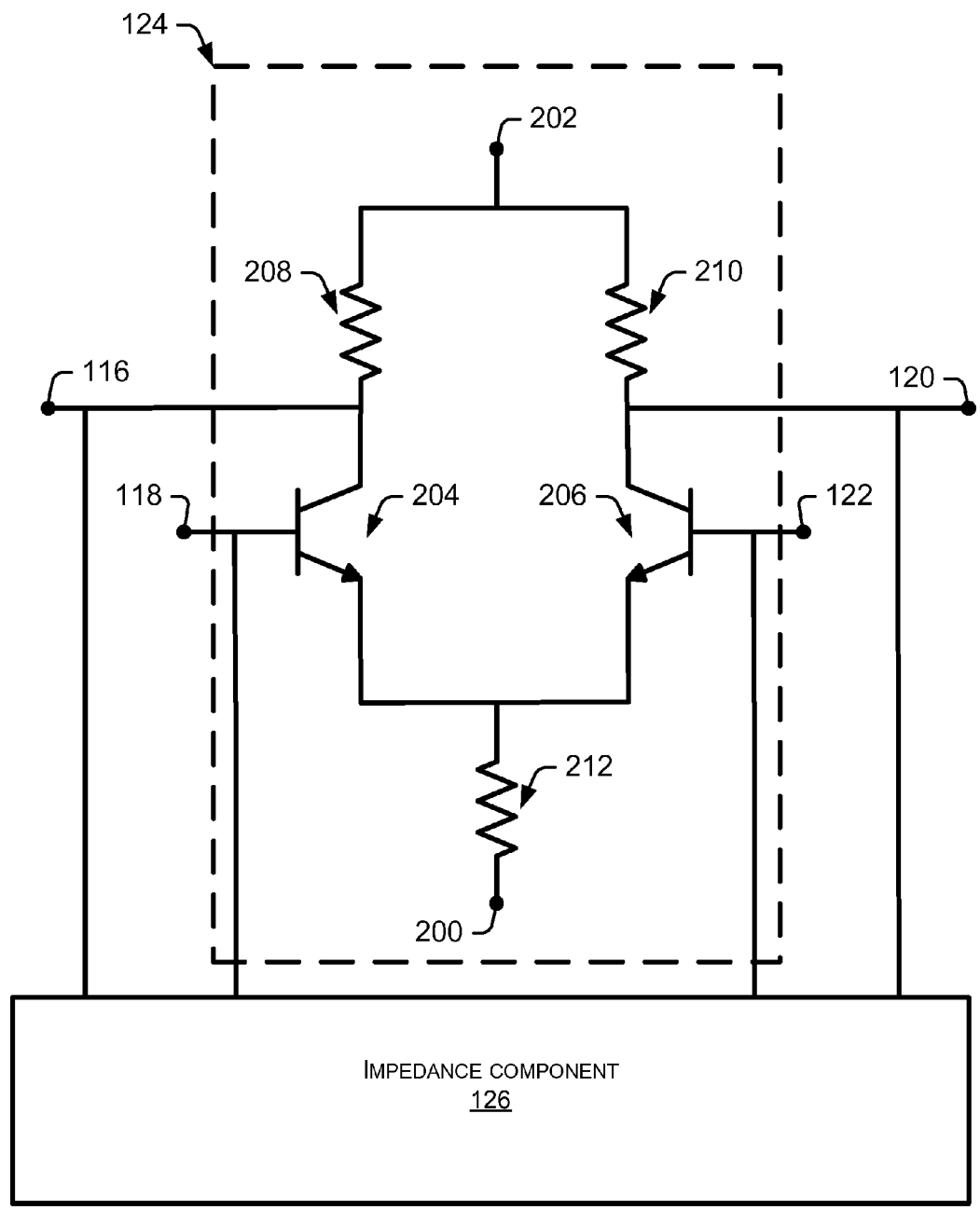
FIG. 2 is a schematic diagram representative of a fully differential amplifier according to one implementation.

FIG. 2 is a schematic diagram showing one implementation of the integrator 110 at the transistor level that is coupled to impedance component 126. The differential amplifier 124 represented in FIG. 2 is but one way to represent a differential amplifier. A person of ordinary skill in the art would be able to design a differential amplifier using similar or different components arranged in a variety of configurations in order to amplify the difference between two signals. By way of example and not limitation, the differential amplifier 124 includes two signal inputs (116, 118), two signal outputs (120, 122), a first power supply input 200, and a second power supply input 202. The differential amplifier 124 may include two parallel transistors (204, 206) that are connected in series with the power supply inputs (200, 202) and connected to a plurality of impedance devices, such as resistors (208, 210, and 212). The types, characteristics, and arrangement of the transistors and resistors will vary between the applications that require the use of a differential amplifier. Although the transistors shown in FIG. 2 are BJT transistors, FET transistors, MOS transistors, or other types of transistors can also be used.

Figure 3A:
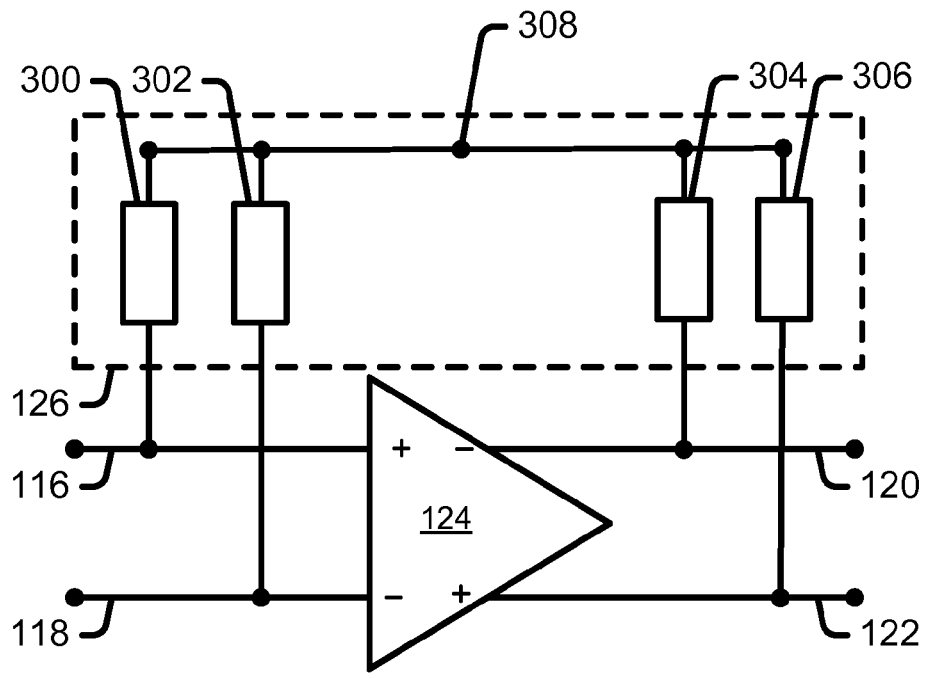
FIGS. 3A-3D are schematic diagrams of implementations for a fully differential amplifier coupled to an impedance component.

FIG. 3A is a schematic diagram of a fully differential amplifier 124 coupled to an impedance component 126. The fully differential amplifier 124 includes a first input 116, a second input 118, a first output 120, and a second output 122 that are each electrically coupled to the impedance component 126.

As noted above, the output common mode voltage is based in part on the output voltages of outputs 120 and 122. In the implementation shown in FIG. 3A, the output common mode voltage is the voltage at node 308 that is representative of the mid-sum of the voltages applied to the right side impedance devices (304 and 306). The input common mode impedance seen from nodes 116 and 118 towards node 308 is the parallel of resistors 302 and 300. If no other common mode impedance to ground is present, the magnitude of the input common mode voltage will be set to the same as node 308 (no common mode current flows through impedance devices (302, 300) and will be based on the voltage drop across the impedance devices (304, 306) from the output voltages on outputs 120 and 122. The impedance for the impedance devices 304 and 306 may be set high enough to prevent shorting (or significant differential current) between the inputs (116, 118) of the differential amplifier 124. Also, the impedance for the impedance devices 300, 302, 304, and 306 may be set to avoid creating an open circuit between the inputs (116, 118) and the outputs (120, 122) of the differential amplifier 124. The left side impedance devices (300, 302) control the application of the input common mode voltage to the inputs (116, 118) of the differential amplifier 124. The impedance values for the impedance devices 300 and 302 may be determined by balancing the impedance of the devices until achieving an acceptable loss of the differential input signal and an acceptable performance of the amplifier. These impedance values will vary according to specific design applications; however a person of ordinary skill in the art would know how to achieve these acceptable values without undue experimentation.

In order to balance or match the input common mode voltage to the output common voltage the impedance devices (300,302) coupled to the inputs (116, 118) of the differential amplifier 124 may have similar or equal impedance values. Likewise, the impedance devices (304, 306) coupled to the outputs (120, 122) of the differential amplifier 124 may have similar or equal impedances values with respect to each other. Although all four impedance devices (300, 302, 304 and 306) may have similar or equal impedance values, it is not required that all four impedance devices share the impedance values in order to match input common mode voltage to the output common mode voltage.

In one implementation, the impedance devices (300, 302, 304 and 306) may be switched capacitors, inductors, or any other device that is capable of providing equivalent impedance to an electrical circuit.

Figure 3B:
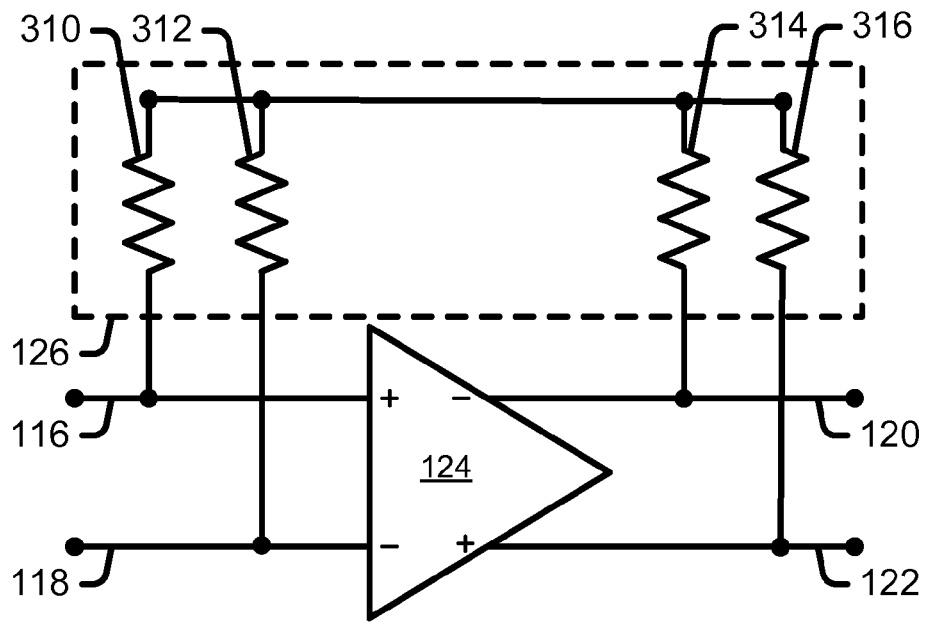

FIG. 3B is a schematic diagram of the fully differential amplifier 124 coupled to an impedance component 126 that includes resistors to minimize the input common mode voltage drift when the fully differential amplifier 124 may be operating without input common mode control. The resistance values for resistors 310 and 312 may be of similar or equal value and the resistance values for resistors 314 and 316 may be of similar or equal value. However, the resistance values do not have to be of similar or equal value between all four resistors (310, 312, 314, and 316). As shown in FIG. 3B, the resistors (310, 312, 314, and 316) are connected in parallel with each other inside the impedance component 126 and the differential amplifier 124.

Figure 3C:
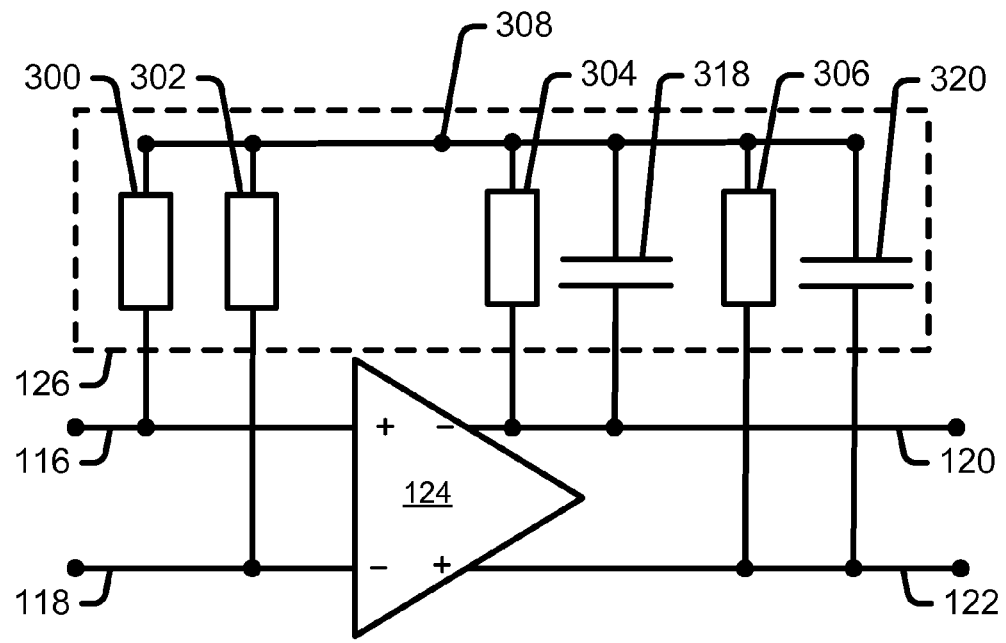

FIG. 3C is a schematic diagram of the impedance component 126 that provides quicker response times to changes in the common mode current for differential amplifier 124. In this implementation, the impedance component 126 may include capacitors coupled in parallel with the impedance devices. For example, the impedance devices (304 and 306) may each be coupled in parallel to a capacitor (318 and 320). Placing the capacitors (318 or 320) in parallel with their respective impedance components enables the impedance components to respond faster to changes in common mode voltage.

Figure 3D:
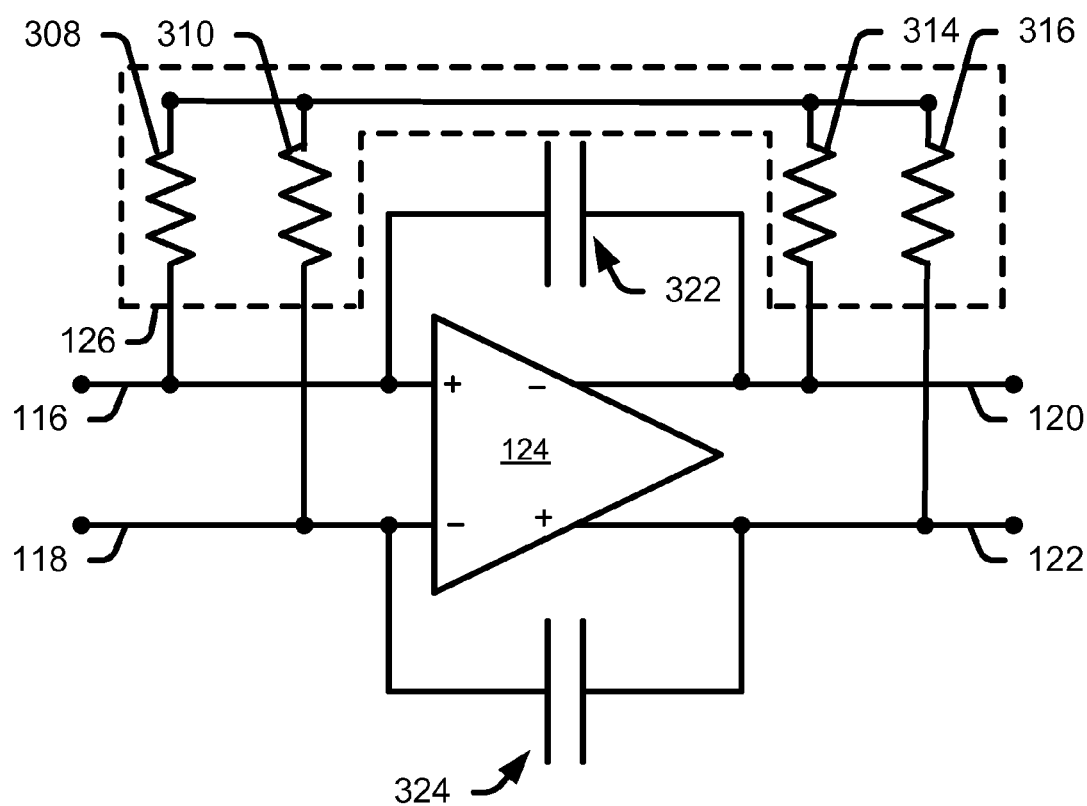

FIG. 3D is a schematic diagram of the impedance component 126 coupled to a fully differential amplifier 124 that includes a negative feedback system as to form an integrator stage. The negative feedback system may include a capacitor 322 connected to the first input 116 and the first output 120 and another capacitor 324 connected to the second input 118 and the second output 122 of the differential amplifier 124. The feedback capacitors 322 and 324 are intended to provide feedback during normal operations of the differential amplifier and may not interfere with the functioning of the impedance component 126 when the differential amplifier 124 is operating without input common mode control. For example, the impedance of the feedback capacitors may not enable the leakage common mode current to flow through the capacitors (322, 324) when no common mode control is applied to the inputs of the differential amplifier 124 by means of a previous stage or by an active control circuit. This implementation in FIG. 3D is an example of how the impedance component 126 may be incorporated into various differential amplifier designs. Accordingly, the impedance component 126 may be integrated with a variety of types of fully differential amplifiers. FIG. 3D reflects but one implementation, but any variation of a fully differential amplifier known by a person of ordinary skill in the art may be incorporated with the impedance component 126.

Example First Stages applied to the Differential Amplifier

Figure 4:
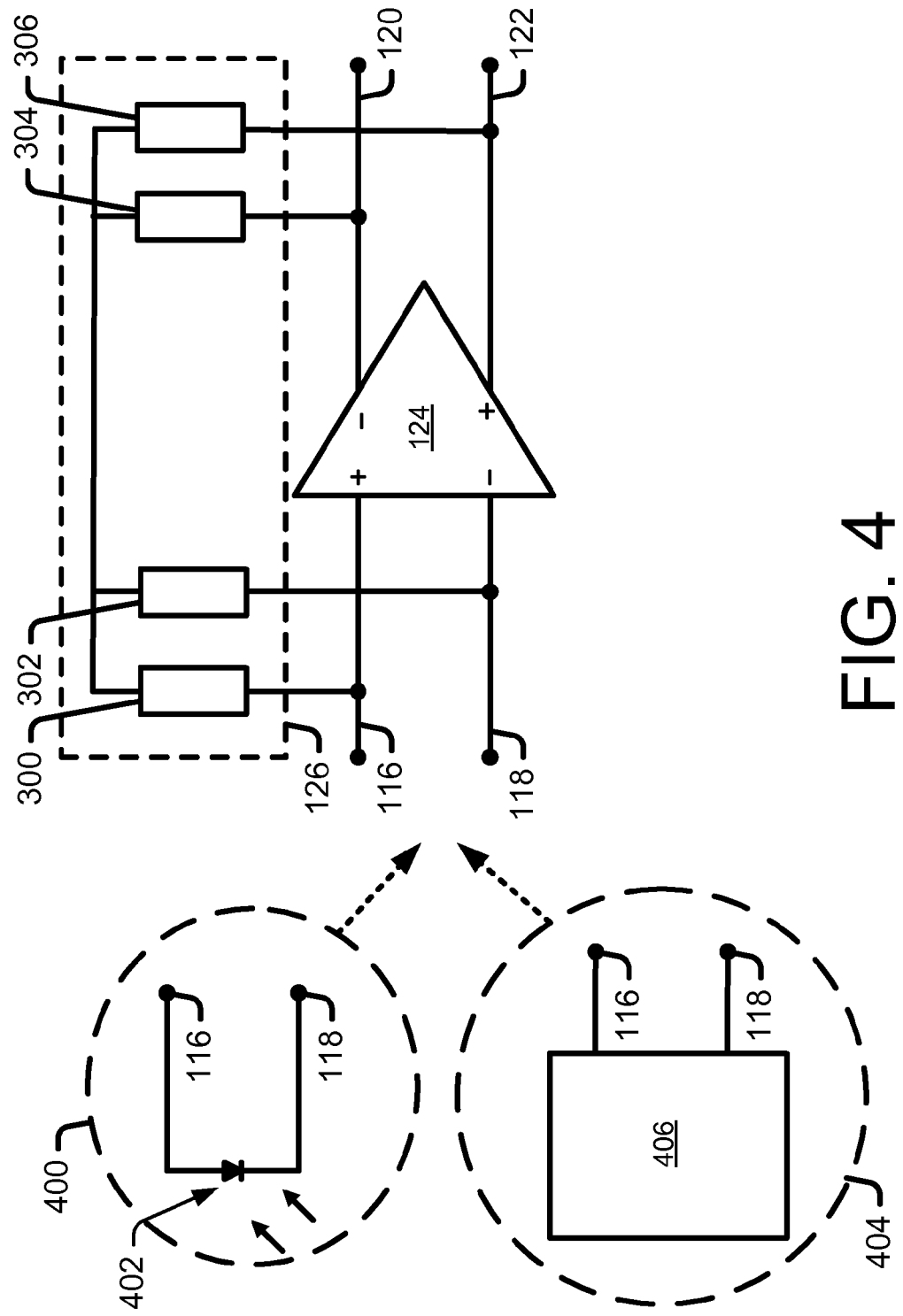
FIG. 4 is a schematic diagram representative of a fully differential amplifier and exemplary input stages.

FIG. 4 provides illustrative implementations of the fully differential amplifier 124 being interfaced in at least two high impedance applications. The first application 400 illustrates a photo diode 402 that may be coupled to the inputs 116, 118 of the differential amplifier 124, in an integrating mode configuration. The photo diode 402 is a floating input current generator that generates current when light is exposed to the surface of the diode 402. Since the photodiode is a floating current source, it has an undefined common mode voltage at the output and in particular it shows extremely high common mode impedance to ground. Thus, for long measurement times, the differential amplifier 124 may experience long periods of use without a controlled input common mode level. When the differential amplifier 124 is in such state, the impedance component 126 operates to provide the very small common current needed to maintain the input common mode within acceptable limits at the inputs of the differential amplifier 124, as discussed above in the remarks to FIGS. 3A.

A second application 404 illustrates a high output impedance device, such as a current feedback Digital-to-Analog Converter (DAC) 406 that provides feedback for the input stage of a sigma-delta modulator 114 (that includes capacitors 322 and 324, as illustrated in FIG. 4). The DAC 306 modifies the incoming analog signal to the differential amplifier inputs based on an information signal or error signal provided by the sigma-delta modulator. The DAC 406 may be coupled to the differential amplifier 124 in parallel with the photo diode 402 or any other analog device that generates an input current at the summing node. Again, when the differential amplifier 124 is in this working conditions, the impedance component 126 operates to minimize the common mode drift at the input of the differential amplifier 124.

Example Common Mode Control Circuit for a Differential Amplifier

Figure 5:
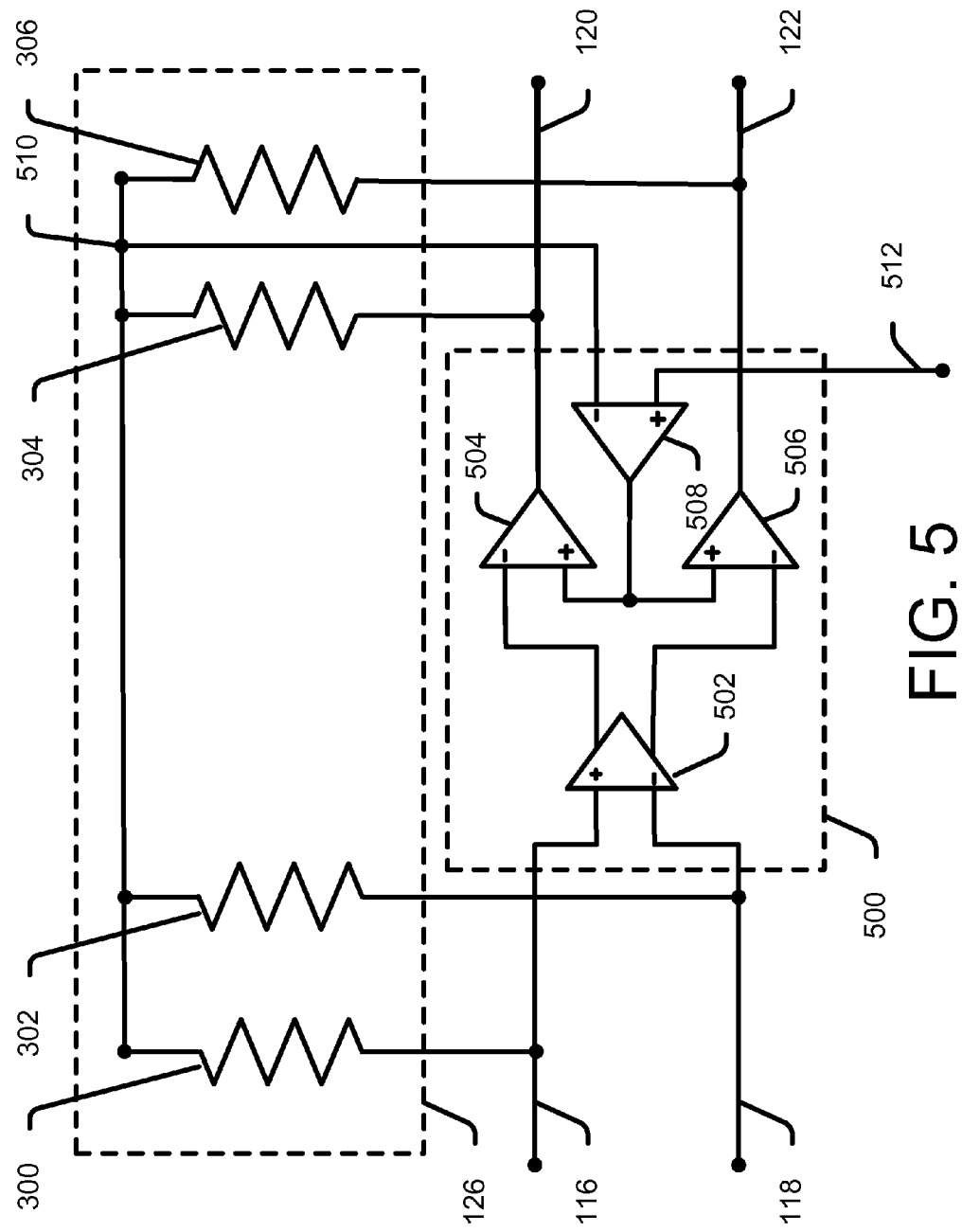
FIG. 5 is a schematic diagram representative of a fully differential amplifier that includes a control circuit.

FIG. 5 provides a schematic implementation of a common mode control circuit integrated into a fully differential amplifier 500. The common mode controlled differential amplifier 500 is coupled to the impedance component 126 that includes four resistors 300, 302, 304, and 306. In the implementation shown in FIG. 5, the fully differential amplifier 500 includes an incoming operational amplifier 502 that provides the differentiated signals from the inputs 116, 118 to a pair of inverting amplifiers 504, 506. The inverting amplifiers 504, 506 amplify and invert the difference between the incoming signals provided via inputs 116 and 118. Also, a common mode control operational amplifier 508 controls the common mode voltage at the output of the differential amplifier 500 by monitoring the common mode voltage 510 against a common mode reference voltage provided via input 512. By way of example and not limitation, the common mode amplifier 508 will adjust the voltage applied to the inverting amplifiers 504, 506 such that the output common mode voltage at 510 matches or may be proportionally optimized against the common mode reference voltage 512. In some implementations, the common mode reference voltage at 512 may be adjusted to accommodate different application conditions applied to the differential amplifier 500. Moreover, the control scheme presented in FIG. 5 is only one example of a control technique, a person of ordinary skill in the art may use additional voltage monitoring and control techniques in order to control the output common mode voltage 510 of the differential amplifier 500. In absence of common mode impedance components to ground and, in this configuration, there is no other significant common mode current flowing to the input nodes, the input common mode will still be controlled also by the loop and will reasonably track the output common mode. The only difference between the common mode will arise from the drops caused by common mode leakage currents (either from the signal source or on the amplifier's input pins) on resistors 300 and 302 in parallel.

Conclusion

Although the implementations have been described in language specific to structural features and/or methodological acts, is the claims are not necessarily limited to the specific features or acts described. Rather, the specific features and acts are disclosed as illustrative forms of implementing the subject matter described in the disclosure.

What is claimed is:

1. A device comprising:
   a differential amplifier having a first input, a second input, a first output, and a second output;
   a first resistor coupled to the first input;
   a second resistor coupled to the second input;
   a third resistor coupled to the first output;
   a fourth resistor coupled to the second output,
   wherein the first, second, third and fourth resistors are further coupled to a node and a voltage associated with the node, and
   a control component that adjusts the voltage based on the voltage and an input reference voltage of the control component.

2. The device of claim 1, wherein the third resistor has a resistance that is equal to a resistance of the fourth resistor.

3. The device of claim 1, wherein the first resistor has a resistance that is equal to a resistance of the second resistor.

4. The device of claim 1, wherein the differential amplifier induces a common mode voltage drift at the input when no common mode control is applied to the first input and to the second input, the voltage drift being reduced in part by the first resistor, the second resistor, the third resistor, and the fourth resistor.

5. The device of claim 1, further comprising:
   a capacitor coupled to the first input and the first output of the differential amplifier; and
   a capacitor coupled to the second input and the second output of the differential amplifier.

6. A device comprising:
   an electrical component comprising:
      a differential input that generates an input common mode voltage for the electrical component when coupled to a component with a high impedance to ground, and a differential output associated with an output common mode voltage;
      a control component coupled to the differential input and the differential output, the control component reducing the high impedance to ground of the differential input and driving the input common mode voltage to a magnitude that is substantially similar to the output common mode voltage; and
      a further control component that adjusts the output common mode voltage output of the electrical component based on a reference voltage and the input common node voltage of the control component.

7. The device of claim 6, wherein the control component comprises:
   a first impedance component coupled to a first output node of the electrical component;
   a second impendence component coupled to a second output node of the electrical component;
   a third impedance component coupled to a first input node of the electrical component; and
   a fourth impedance component coupled to a second input node of the electrical component.

8. The device of claim 7, wherein the first impedance component, the second impedance component, the third impedance component, and the fourth impedance component are resistors.

9. The device of claim 7, wherein the first impedance component, the second impedance component, the third impedance component, and the fourth impedance component are switched capacitors.

10. The device of claim 6, wherein the output common mode voltage is based in part on a voltage provided to the first output node and a voltage provided to the second output node when the common voltage is applied to both the first input node and the second input node.

11. The device of claim 6, wherein the input common mode voltage is based in part on a voltage applied in parallel to the first impedance device, the second impedance device, the third impedance device, and the fourth impedance device.

12. The device of claim 6, wherein the electrical component is an amplifier.

13. The device of claim 6, further comprising a high impedance component coupled to the differential input of the electrical component, the high impedance component being photo diode or a current steering digital to analog converter.

14. A differential amplifier comprising:
   a first transistor coupled to a first input and a first output of the differential amplifier;
   a second transistor coupled to a second input and a second output of the differential amplifier, the second transistor being coupled in parallel with the first transistor;
   a first impedance component coupled to the first input of the differential amplifier;
   a second impedance component coupled to the second input of the differential amplifier;
   a third impedance component coupled to the first output of the differential amplifier;
   a fourth impedance component coupled to the second output of the differential amplifier;
   a first capacitor coupled in parallel with the third impedance component;
   a second capacitor coupled in parallel with the fourth impedance component,
   wherein the first, second, third and fourth impedance components are coupled to a node and a voltage associated with the node, and the first and second capacitors are coupled to the node, and the voltage associated with the node, and
   a control component to adjust the voltage based on the voltage and an input reference voltage of the control component.

15. The differential amplifier of claim 14, wherein the first and second impedance components are equal in resistance and the third and fourth impedance components are equal in resistance.

16. The differential amplifier of claim 14, wherein the first, second, third, and fourth impedance components are resistors.

17. The differential amplifier of claim 14, wherein the first, second, third, and fourth impedance components are switched capacitors.

18. The differential amplifier of claim 14, wherein the first, second, third, and fourth impedance components are a combination of resistors or switched capacitors.

19. The differential amplifier of claim 14, wherein the first output and the second output of the differential amplifier are coupled to a sigma-delta modulator.

* * * * *